United States Patent
Sakuragi

[19]
[11] Patent Number: 6,097,088
[45] Date of Patent: Aug. 1, 2000

[54] THERMOELECTRIC ELEMENT AND COOLING OR HEATING DEVICE PROVIDED WITH THE SAME

[75] Inventor: Shiro Sakuragi, Ibaraki-ken, Japan

[73] Assignees: Morix Co., Ltd., Aichi, Japan; Silicon Engineering Laboratory Ltd., Zoug, Switzerland; Sunx Trading Co., Ltd., Tokyo, Japan

[21] Appl. No.: 08/836,746

[22] PCT Filed: Jul. 30, 1996

[86] PCT No.: PCT/JP96/02145

§ 371 Date: May 21, 1997

§ 102(e) Date: May 21, 1997

[87] PCT Pub. No.: WO97/13284

PCT Pub. Date: Apr. 10, 1997

[30] Foreign Application Priority Data

Sep. 29, 1995 [JP] Japan ..................................... 7-276751
Dec. 26, 1995 [JP] Japan ..................................... 7-351521

[51] Int. Cl.[7] .................................................. H01L 23/34
[52] U.S. Cl. .......................... 257/712; 257/701; 257/467
[58] Field of Search ..................................... 257/930, 467, 257/470, 715, 712, 701, 717

[56] References Cited

U.S. PATENT DOCUMENTS 3,240,628  3/1966  Sonntag, Jr. .
4,907,060  3/1990  Nelson et al. ........................... 257/930
5,031,689  7/1991  Jones et al. .
5,156,004  10/1992  Wu et al. .

FOREIGN PATENT DOCUMENTS 0117743   9/1984   European Pat. Off. .
1323569   7/1963   France .
2650593   5/1977   Germany ............................... 257/930
4326662   2/1995   Germany .
34-595    2/1959   Japan .
37-24548  9/1962   Japan .
38-27922  12/1963  Japan .
40-23300  10/1965  Japan .
48-32942  10/1973  Japan .
58-58348  4/1983   Japan .
62-15842  1/1987   Japan .
7-202275  8/1995   Japan .
2119170   11/1983  United Kingdom .

Primary Examiner—Roy Potter
Attorney, Agent, or Firm—Smith, Gambrell & Russell, LLP

[57] ABSTRACT

A thermoelectric chip unit (1) comprises equal numbers of n-type thermoelectric semiconductor elements (30n) and p-type thermoelectric semiconductor elements (30p) that are held embedded within a single chip substrate (2). It is therefore difficult for the crystals of the thermoelectric semiconductor elements (30) to split at the cleavage surfaces thereof. The thermoelectric chip unit (1) can be made to be flexible by forming the chip substrate (2) of a flexible insulator such as plastic or rubber. A thermoelectric unit (4) comprises this thermoelectric chip unit (1) to which are attached electrodes (5). The thermoelectric unit (4) can be made to be flexible by forming the electrodes (5) of flexible members such as thin copper plates. A thermoelectric module (6) comprises the thermoelectric unit (4) to which is attached a flexible sheet or cover (8). This thermoelectric module (6) can be used as a cooling device for a computer's CPU or a semiconductor laser, or in an insulated refrigerator.

12 Claims, 7 Drawing Sheets

THERMOELECTRIC ELEMENT AND COOLING OR HEATING DEVICE PROVIDED WITH THE SAME

TECHNICAL FIELD

The present invention relates to a thermoelectric element such as a thermoelectric chip unit, thermoelectric unit, thermoelectric module, or thermoelectric sheet which is flexible and uses thermoelectric semiconductor elements, and a cooling or heating device that uses such elements.

BACKGROUND OF ART

Thermoelectric elements that use thermoelectric semiconductor elements made of compounds such as bismuth/tellurium compounds, iron/silicon compounds, or cobalt/antimony compounds are used in applications such as cooling or heating devices and thermal power devices. Such a thermoelectric element is convenient as a cooling or heating source that does not use liquids or gases, takes up little space and is not subject to rotational friction, and does not require maintenance.

This thermoelectric element generally comprises two types of thermoelectric semiconductor element, p-type and n-type, arranged alternately in an array, with the thermoelectric semiconductor elements being connected to electrodes by soldering to form a "π"-shaped series circuit; the thermoelectric semiconductor elements and metal electrodes are sandwiched between ceramic substrates having metal films, and this assembly is widely used as a thermoelectric module.

A thermoelectric module that is known in the prior art is shown in FIG. 22. As shown in this figure, n-type thermoelectric semiconductor elements and p-type thermoelectric semiconductor elements 42 are arrayed alternately in a thermoelectric module 41 (in FIG. 22, only the thermoelectric semiconductor element at the right-hand end is given a reference number, as representative of a plurality of elements), and the n-type thermoelectric semiconductor elements and p-type thermoelectric semiconductor elements 42 are connected to electrodes 43. Upper and lower surfaces of the thermoelectric semiconductor elements 42 are connected alternately to the electrodes 43, so that all of the elements are eventually connected in series. The connections between the electrodes 43 and the thermoelectric semiconductor elements 42 are performed by soldering. The electrodes 43 on each of the upper and lower surfaces are connected to ceramic substrates 44 that are metallized with a metal such as copper or nickel, to fix the entire assembly together. The thus constructed thermoelectric element is usually called a thermoelectric module.

A power source is connected to electrodes of this thermoelectric module 41, and, when a current flows in the direction from each n-type element to a p-type element, the Peltier effect ensures that heat is absorbed by the upper portion of the "π" shape and heat is generated by the lower side thereof. Reversing the connection direction of the electrodes changes the directions in which heat is absorbed and generated. This phenomenon is utilized so that the thermoelectric element can be used in a cooling or heating device. Such a thermoelectric module is useful in a wide range of applications, from the cooling of devices such as computer CPUs and semiconductor lasers to use in insulated refrigerators.

Thermoelectric semiconductor elements of bismuth/tellurium compounds, which are representative of use in such thermoelectric modules, have a problem in that the crystals thereof tend to split at cleavage surfaces. Thus, in the prior art, grown monocrystals are first sliced and the sliced crystals are diced to form rectangular shapes of dimensions on the order of 1.5 mm×1.5 mm×2 mm, which are used in thermoelectric modules. Since the crystals split easily at the cleavage surfaces, the rectangular thermoelectric semiconductor elements are usually arrayed by hand, using tweezers, on a ceramic substrate that has been processed with a thin metal film, then, after being arrayed, the elements are soldered to metal electrodes. This means that the resultant thermoelectric module is extremely firm and lacks flexibility. The soldering itself also reduces flexibility, so the thermoelectric module is rigid. On top of that, the use of a ceramic substrate means that the thermoelectric module has no bendability or flexibility, and is stiff.

The dimensions of each thermoelectric semiconductor element are small at 1.5 mm×1.5 mm×2 mm, so that the dimensions of the thermoelectric element itself when it is put on the market as a commercial product are also extremely small at most approximately 40×40 mm or 60×60 mm.

Furthermore, since the thermoelectric semiconductor elements can break easily, a thermoelectric module is configured to have a high installation density of thermoelectric semiconductor elements on a ceramic substrate. The resultant surface area of the array of thermoelectric semiconductor elements (in other words, the cooling or heating surface area thereof) is small so that the efficiency thereof in cooling or heating a large surface area is extremely poor. In addition, the provision of supplementary equipment such as a heat sink or fan to radiate excess heat makes this module too large.

The prior-art thermoelectric module 41 is held together by a sandwich structure of the upper and lower substrates 44 made of ceramic, and thus the upper and lower substrates 44 are a vital part of the structure of the module. This means that the entire thermoelectric element is thick, and thus the thermal conductivity efficiency thereof is poor.

To improve the thermal conductivity in this case, experiments have been performed into using insulating films or flexible resin sheets as substrates, instead of ceramics. This use of a film or resin sheet as a substrate makes it possible to reduce the thickness of the substrates on which the thermoelectric semiconductor elements are installed, and, as a result, improve the thermal conductivity characteristics.

For example, a technique disclosed in Japanese Patent Application Laid-Open No. 3-137462 relates to the disposition of thermoelectric semiconductor elements on an insulating film substrate. With this technique, the density of thermoelectric semiconductor elements is fairly high. In addition, a pressure vessel is provided on a heat-absorbing side thereof, so the cooling or heating device is rigid.

Japanese Patent Application Laid-Open No. 7-202275 discloses a technique of using a copper plate attached to a resin sheet having flexibility and thermal resistance, as an electrode, and installing thermoelectric semiconductor elements on such an electrode. With this technique, the completed thermoelectric module is soldered fixedly to a copper plate over resin, so that the complete module is rigid and lacks flexibility.

In both cases, the objective is to reduce the total thickness of the thermoelectric element and increase the heat-transfer efficiency thereof. However, each of these techniques involves a high arrangement density of thermoelectric semiconductor elements, so that the entire thermoelectric element lacks flexibility. In other words, both applications give useful examples for improving the heat-transfer efficiency, but they do not disclose any techniques relating to flexible cooling or heating elements.

The present invention therefore provides a thermoelectric semiconductor chip unit, thermoelectric unit, and thermoelectric module wherein thermoelectric semiconductor crystals are not likely to split along cleavage surfaces.

This invention also provides a thermoelectric chip unit, thermoelectric unit, thermoelectric module, and thermoelectric sheet which has properties such as flexibility.

Furthermore, this invention provides a cooling or heatingdevice which has characteristics such that it can cover a large cooling or heating surface area, requires only compact supplementary equipment for radiating heat, and can be applied even to an objects having a complicated shape.

DISCLOSURE OF INVENTION

A thermoelectric chip unit in accordance with this invention comprises equal numbers of n-type thermoelectric semiconductor elements and p-type thermoelectric semiconductor elements, together with a single chip substrate, wherein said n-type thermoelectric semiconductor elements and p-type thermoelectric semiconductor elements are held embedded within said chip substrate.

Since the thermoelectric chip unit of this invention has a configuration in which thermoelectric semiconductor elements are held embedded within a single chip substrate, it is characterized in that the semiconductor crystals are not likely to split at cleavage surface. If the chip substrate is configured of a hard insulator, the strength of the thermoelectric semiconductor elements can be reinforced by that of the chip substrate. If the chip substrate is configured of a flexible insulator, a flexible thermoelectric chip unit can be obtained.

In a thermoelectric unit in accordance with this invention, the thermoelectric semiconductor elements of the thermoelectric chip unit of this invention are connected to electrodes.

A thermoelectric module in accordance with this invention consists of the thermoelectric unit of this invention covered with a flexible cover or mounted on a flexible sheet.

A cooling or heating device in accordance with this invention uses the thermoelectric module of this invention as a cooling or heating source. The cooling or heating device of this invention can also use a thermoelectric sheet in which prior-art thermoelectric modules are attached at a certain spacing to a flexible sheet.

Since the cooling or heating device of this invention is flexible, it has a good cooling or heating efficiency and can be attached easily to an object of a complicated shape.

BEST MODE FOR CARRYING OUT THE INVENTION

Figure 1:
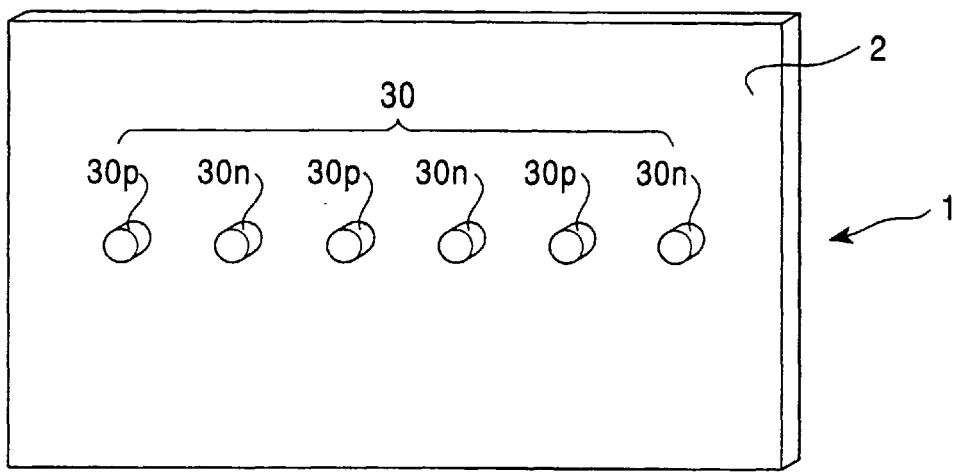
FIG. 1 is a perspective view of an example of the configuration of the thermoelectric chip unit of this invention.
Figure 2:
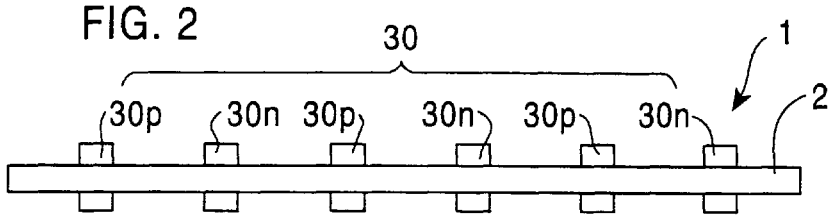
FIG. 2 is a front view of this example of the configuration of the thermoelectric chip unit of this invent.

A perspective view of an example of the structure of the thermoelectric chip unit of this invention is shown in FIG. 1 and a plan view thereof is shown in FIG. 2. This thermoelectric chip unit 1 has a configuration in which thermoelectric semiconductor elements 30 (In FIG. 1 and FIG. 2,there are three n-type thermoelectric semiconductor elements 30n and three p-type thermoelectric semiconductor elements 30p) are held embedded in a chip substrate 2.

The chip substrate 2 is configured of a hard insulator formed of ceramic or glass epoxy, or a flexible insulator such as plastic, rubber, or an elastomer. If it is configured of a hard insulator, the strength of the thermoelectric semiconductor elements 30 can be reinforced by the chip substrate 2. If it is configured of a flexible insulator, a flexible thermoelectric module can be fabricated.

The thermoelectric semiconductor elements 30 are configured of semiconductor monocrystals of a material such as bismuth telluride, having a small diameter on the order of 0.5 to 3.0 mm. The thickness of the chip substrate is less than that of the thermoelectric semiconductor elements 30, facilitating the process of connecting this thermoelectric chip unit 1 to the electrodes of a thermoelectric module.

A thermoelectric chip unit of a configuration such that thermoelectric semiconductor elements are held by a single chip substrate does not exist in the prior art. The use of this configuration in which thermoelectric semiconductor elements are held embedded in a single chip substrate has the advantage that it is difficult for the semiconductor crystals to split at cleavage surfaces thereof. Particularly when the chip substrate 2 is configured of a flexible material, it is difficult for the crystals to split when a situation occurs in which the chip substrate 2 becomes bent. In contrast thereto, the semiconductor crystals are held by two substrates in the prior-art thermoelectric module, so these crystals are likely to split when the substrate is bent.

The method of fabricating this thermoelectric chip unit will now be described with reference to FIGS. 3 to 10.

Figure 3:
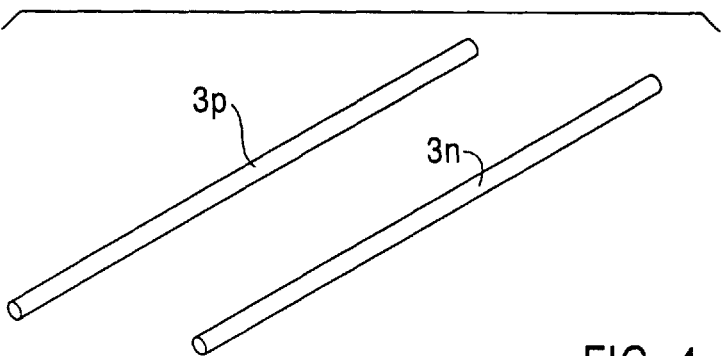
FIG. 3 shows thermoelectric semiconductor elements used in the fabrication of the thermoelectric chip unit.
Figure 4:
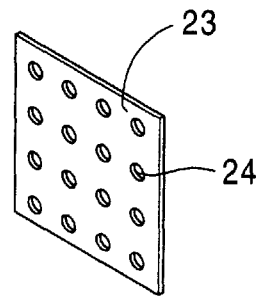
FIG. 4 is a perspective view of a perforated insulating plate used in the fabrication of the thermoelectric chip unit.
Figure 5:
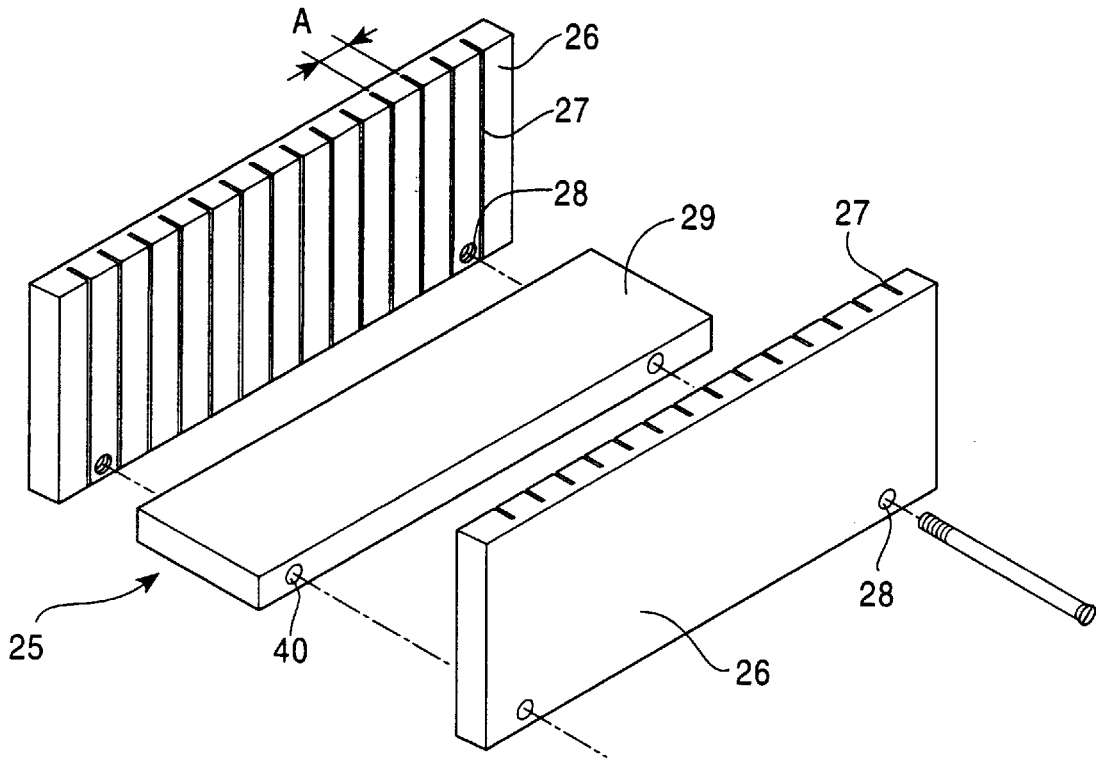
FIG. 5 is an exploded perspective view of an assembly jig used in the fabrication of the thermoelectric chip unit.

FIGS. 3 to 5 show the materials and tools used in the fabrication of the thermoelectric chip unit. As shown in FIG. 3, p-type needle monocrystals 3p and n-type needle monocrystals 3n, each of a length of 150 mm and a diameter of 2 mm, form the thermoelectric semiconductor elements. These thermoelectric semiconductor elements are fabricated by a method disclosed in the specifications and drawings of patent applications which were taken out by the present inventors as Japanese Patent Application No. 6-336295 on Dec. 22, 1994, and Japanese Patent Application No. 7-276751 on Sep. 22, 1995. This fabrication method makes it possible to form needle monocrystals having a diameter on the order of 0.5 to 3.0 mm. It has also been determined that cylindrical semiconductor crystal rods formed by this fabrication method are more difficult to split along the cleavage surfaces thereof than angular semiconductor crystals formed by prior-art methods.

The material of a perforated insulating plate 23 shown in FIG. 4 differs according to whether the chip substrate 2 shown in FIG. 1 is a hard insulator or a flexible insulator. If it is a hard insulator, a material such as ceramic or glass epoxy can be used. If it is a flexible insulator a material such as plastic, rubber, or an elastomer can be used. The thickness thereof is 0.3 to 0.5 mm, regardless of whether a hard or flexible insulator is used, and a V-shaped groove (not shown in the figure) is formed in the vertical direction in the vicinity of each side edge thereof.

A large number of holes 24 are formed in the perforated insulating plate 23 for the insertion of the p-type needle monocrystals 3p and n-type needle monocrystals 3n. The arrangement of these holes 24 makes it possible to adjust the installation density of the thermoelectric semiconductor elements as appropriate. Any desired arrangement of elements within the thermoelectric chip unit can be selected according to the number of holes in the perforated insulating plate and the numbers of rows and columns thereof.

An assembly jig 25, shown as an exploded perspective view in FIG. 5, is configured of two grooved side plates 26 and a single base plate 29. These are made of aluminum and are fixed together by screws passed between screw holes 28. Several dozen grooves 27 are formed in the vertical direction in each of the grooved side plates 26 at a predetermined spacing of A, for example, 2 to 3 mm. The previously mentioned perforated insulating plate 23 is fitted into these grooves 27.

Figure 6:
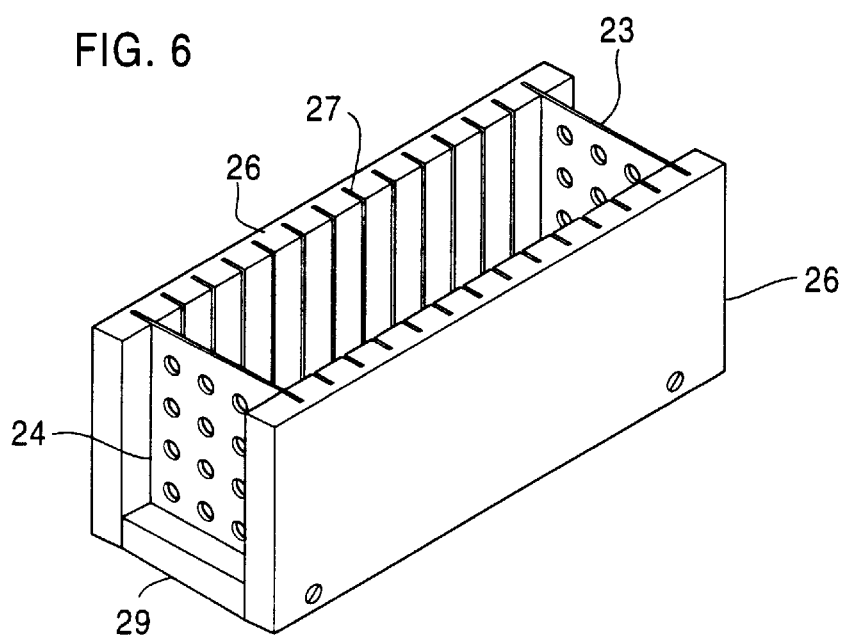
FIG. 6 is a perspective view of perforated insulating plates inserted into the assembly jig.

The perforated insulating plate 23 is first assembled into the assembly jig, as shown in FIG. 6. During this process, the perforated insulating plate 23 is held upright by the fitting of the two edges of the perforated insulating plate 23 into the grooves 27 formed vertically in the side surfaces of the grooved side plates 26. Note that only two perforated insulating plates are shown at the two ends in this figure, for convenience.

Figure 7:
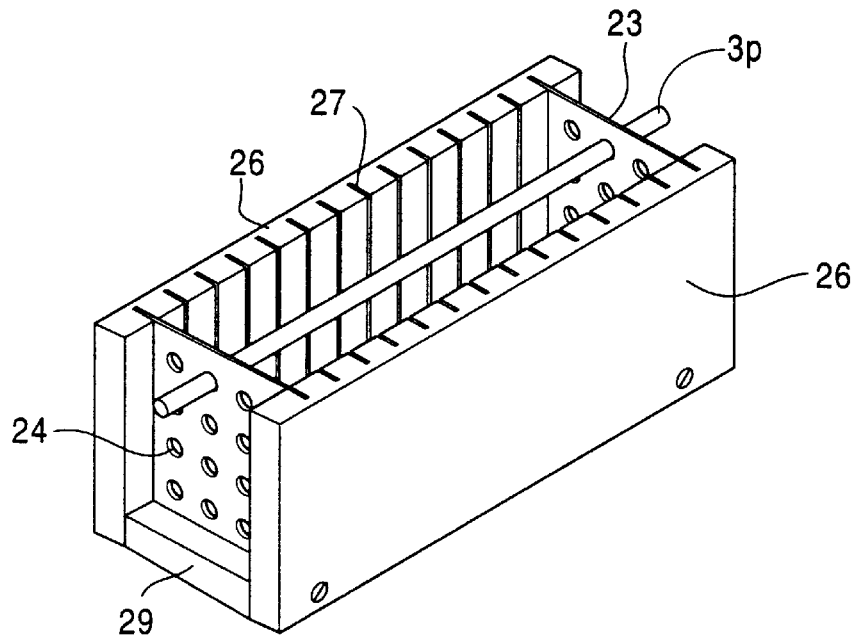
FIG. 7 is a perspective view of thermoelectric semiconductor elements passed through holes in the perforated insulating plates.

The p-type needle monocrystals 3p and n-type needle monocrystals 3n are then passed through the holes 24 of the perforated insulating plate 23, as shown in FIG. 7. In this case, the p-type and n-type components are arrayed alternately. Note that only one of the p-type needle monocrystals 3p is shown in this figure, for convenience.

An adhesive such as a polyamide is then injected into spaces formed between the assembly jig and the several dozen perforated insulating plates 23, to fix the p-type needle monocrystals 3p and n-type needle monocrystals 3n to the perforated insulating plates 23.

Figure 8:
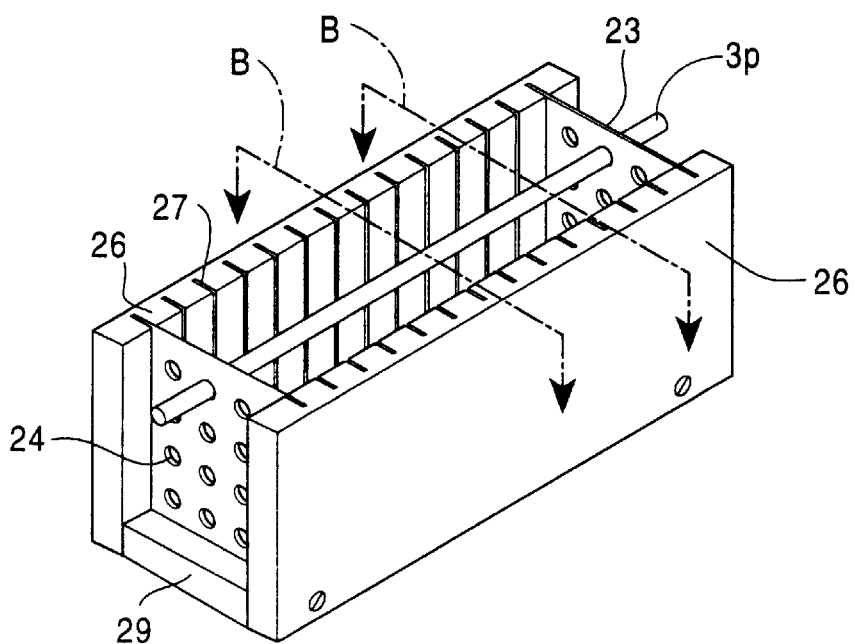
FIG. 8 shows how the thermoelectric semiconductor elements are cut together with the assembly jig.
Figure 9:
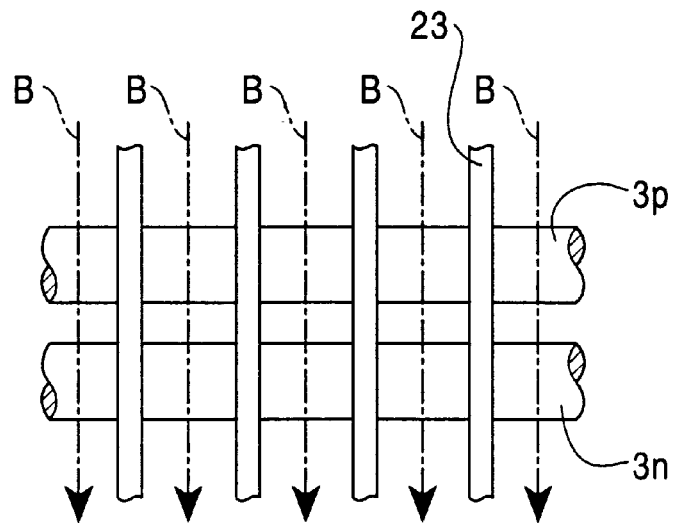
FIG. 9 is an enlarged view of portions to be cut.
Figure 10:
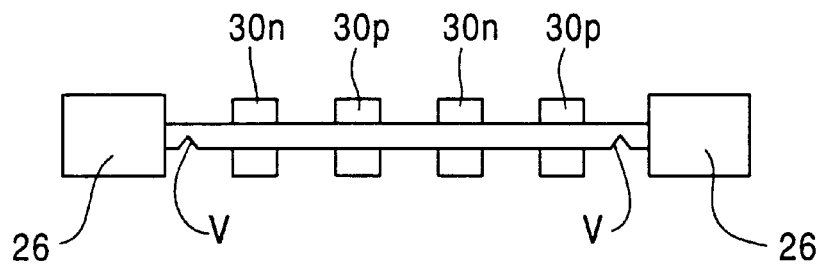
FIG. 10 shows a thermoelectric chip unit obtained by cutting, with grooved side plates still attached.

Next, the p-type needle monocrystals 3p and n-type needle monocrystals 3n attached to the perforated insulating plates 23 by adhesive are cut from portions intermediate between the perforated insulating plates 23. Since these are fixed to the perforated insulating plates 23 and the assembly jig 25 by this adhesive, they are cut together with the assembly jig, as shown in FIG. 8. The cutting is done with a wire saw as shown by arrows B in FIG. 8. Only two cutting sections are shown in FIG. 8. An enlargement of the portions to be cut is shown in FIG. 9. Note that the surfaces of the p-type needle monocrystals 3p and n-type needle monocrystals 3n are covered with adhesive, although this is not shown in FIG. 9. This cutting makes it possible to create several dozen thermoelectric chip units simultaneously, as shown in FIG. 10. It should be noted, however, that at this stage, the cut grooved side plates 26 of the assembly jig and the perforated insulating plates 23 are still attached, so the grooved side plates 26 on either side are removed by applying force thereto to bend them at the positions of the V-shaped grooves V thereof.

The above described process makes it possible to fabricate several dozen thermoelectric chip units, such as is shown in FIGS. 1 and 2.

A thermoelectric unit can be obtained by attaching electrodes to the thermoelectric semiconductor elements of the thus fabricated thermoelectric chip unit, by means such as soldering. If the chip substrate of each thermoelectric chip unit is a flexible insulator, this thermoelectric unit will inevitably be flexible too. Note that present inventors call an assembly of electrodes connected to a thermoelectric chip unit a "thermoelectric unit".

The electrodes used in this thermoelectric unit could of course be metal plates such as copper plates, which are used ordinarily, or flexible electrodes could also be used. Examples that can be cited as flexible electrodes include thin metal plates such as copper or phosphor bronze plates, rubber or plastic having conductivity and of a resistance that is sufficiently less than that of the thermoelectric semiconductor elements, or metal netting or the like. If a flexible electrode of this type is used, the flexibility of the thermoelectric unit itself will be increased further.

Figure 11:
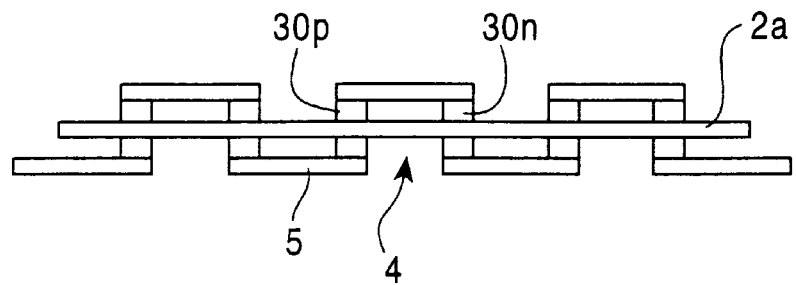
FIG. 11 is a front view of an example of a thermoelectric unit.

A side view of an example of this thermoelectric unit is shown in FIG. 11. This thermoelectric unit 4 is obtained from a flexible-insulator chip substrate 2a, a thermoelectric chip unit in which n-type thermoelectric semiconductor elements 30n and p-type thermoelectric semiconductor elements 30p are fitted, and electrodes 5 formed of thin copper plates attached by soldering. This assembly could, of course, be shipped in this state as a finished product. The electrodes 5 used in this case have a thickness on the order of 0.1 mm, so they are sufficiently flexible. The flexibility can be further increased by increasing the spacing at which the thermoelectric semiconductor elements 30 are arranged. A value of installation density of the thermoelectric semiconductor elements 30 that is optimal for the relationship between flexibility and cooling or heating efficiency will, in practice, be sought.

Various different implementations of thermoelectric units can be created, depending on the design of the arrangement of holes 24 in the perforated insulating plate 23. Examples thereof are shown in FIGS. 12 to 15. In each of these figures, A is a plan view and B is a side view. The solid and hollow ovals shown in the plan views are used to differentiate between p-type and n-type elements.

Figure 12A:
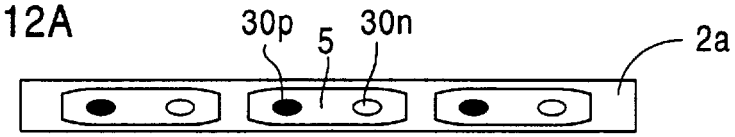
FIGS. 12A and 12B show is a plan view and a front view of another example of a thermoelectric unit.
Figure 12B:
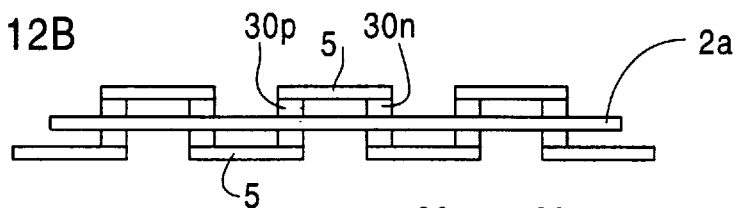
Figure 13A:
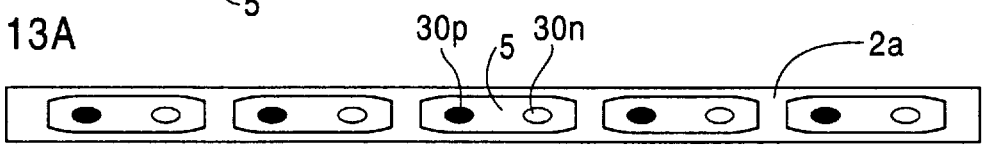
FIGS. 13A and 13B show is a plan view and a front view of yet another example of a thermoelectric unit.
Figure 13B:
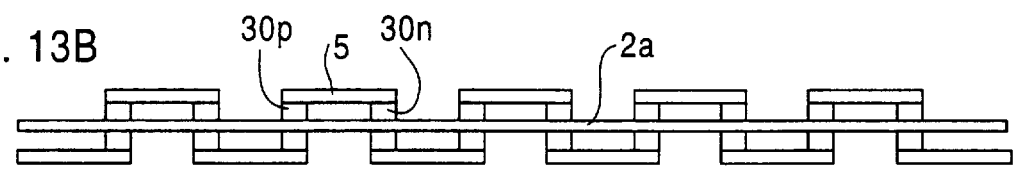
Figure 14A:
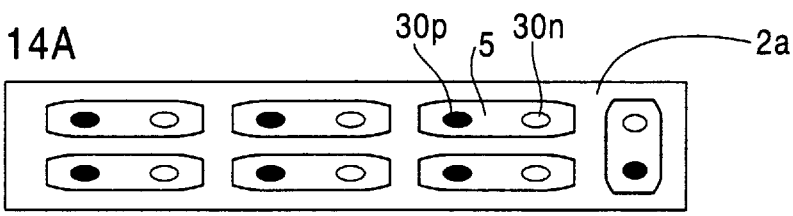
FIGS. 14A and 14B show is a plan view and a front view of a further example of a thermoelectric unit.
Figure 14B:
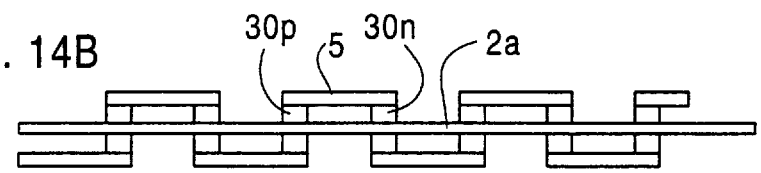
Figure 15A:
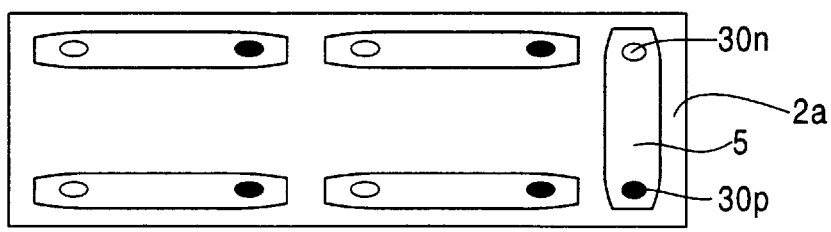
FIGS. 15A and 15B show is a plan view and a front view of a still further example of a thermoelectric unit.
Figure 15B:
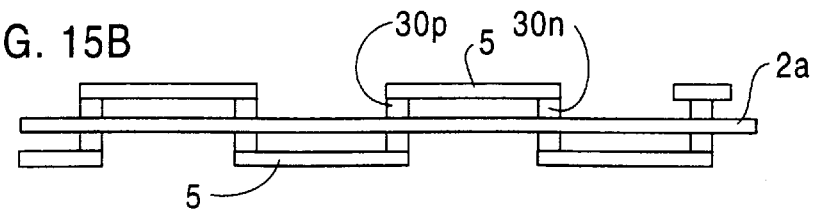

FIG. 12 shows a thermoelectric unit in which six thermoelectric semiconductor elements are arrayed in a single row and FIG. 13 shows a thermoelectric unit in which ten thermoelectric semiconductor elements are arrayed in a single row. FIG. 14 shows an array of 14 thermoelectric semiconductor elements in two rows. FIG. 15 shows an array of ten thermoelectric semiconductor elements in two rows.

Figure 16:
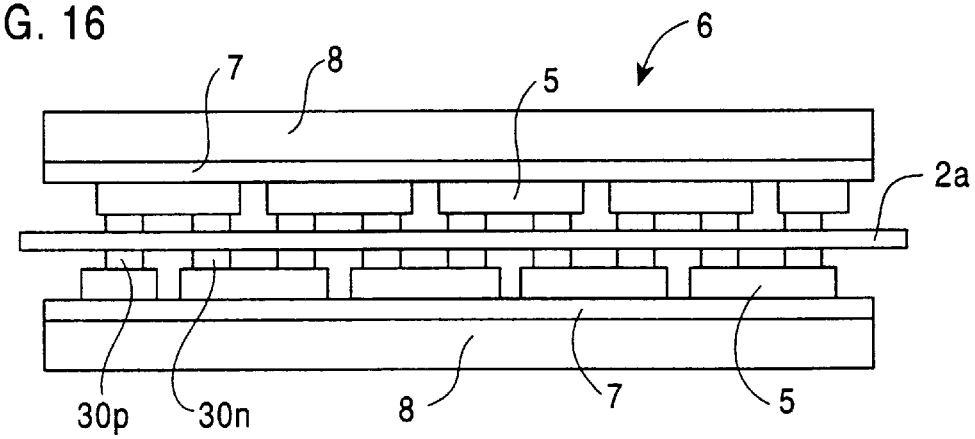
FIG. 16 is a front view of an example of a thermoelectric module

A thermoelectric module implemented by placing an insulating cover over the thermoelectric unit of FIG. 11 is shown in FIG. 16. This thermoelectric module 6 has sufficient flexibility, in contrast to the stiffness of the prior-art thermoelectric module which has absolutely no flexibility. The thermoelectric semiconductor elements of a prior-art thermoelectric module are not embedded in a substrate, as described previously, but are configured in a sandwich structure between a substrate on a heat-absorbing side and a substrate on a heat-radiating side, as described previously.

As shown in FIG. 16, a flexible insulator 7 is provided above and below the electrodes 5 of the thermoelectric chip unit, and a flexible insulating cover or sheet 8 can also be provided above and below these flexible insulators 7. The flexible insulators 7 themselves can, of course, also act as flexible sheets or covers. If thermally conductive silicone sheets are used as the flexible insulator, for example, they can also fulfill the function of flexible insulating covers or sheets at the same time.

A flexible thermoelectric module can be obtained in the above manner. For this, any flexible sheets other than thermally conductive silicone sheets can of course be used. Metal netting, thin metal plates, or the like can also be used on top of a thermoelectric module covered with silicone sheets.

The thermoelectric units and thermoelectric modules described above can each be marketed as stand-alone products, and they can each be used directly in a number of applications. However, turning them into thermoelectric sheets would further increase their market value and further increase their range of application. Mounting thermoelectric units or thermoelectric modules on a flexible sheet makes it possible to obtain a flexible thermoelectric sheet. The present inventors call a thermoelectric element in which thermoelectric units or thermoelectric modules are mounted on an insulating sheet a "thermoelectric sheet".

Figure 17A:
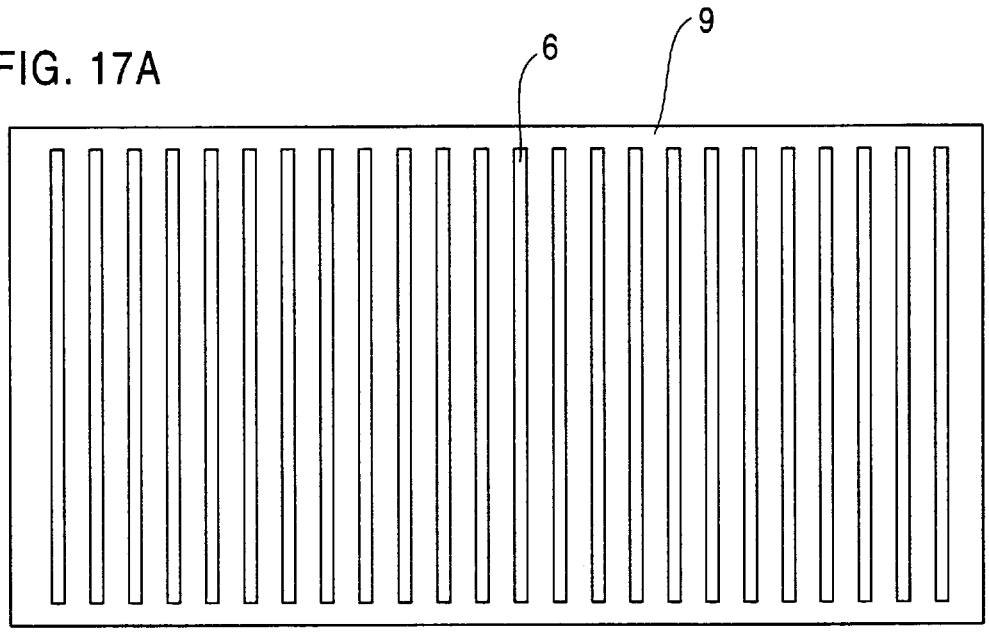
FIGS. 17A and 17B show is a plan view and a front view of an example of a thermoelectric sheet
Figure 17B:
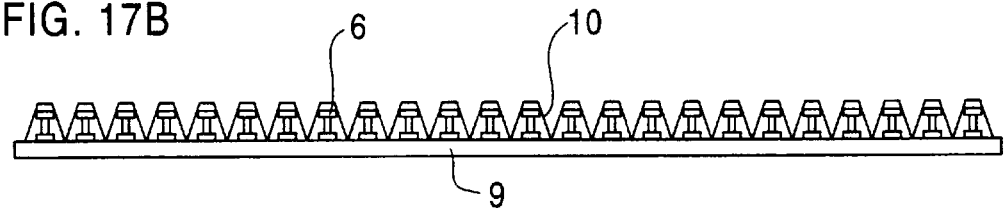
Figure 18:
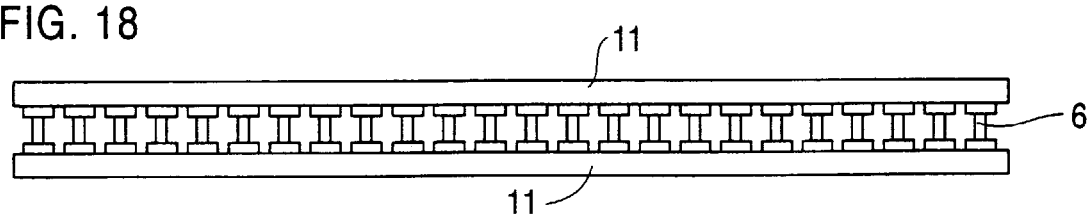
FIG. 18 is a front view of another example of a thermoelectric sheet.

Examples of these thermoelectric sheets are shown in FIGS. 17 and 18. A thermoelectric sheet is obtained by installing thermoelectric modules 6 on a flexible insulating sheet 9. A flexible cover 10 can also be provided for protection. Note that FIG. 17A is a plan view and FIGS. 17B and 18 are front views. FIG. 18 shows an example in which sheets 11 are used on both of the upper and lower surfaces, and FIG. 17B shows an example in which a sheet 9 is used on the lower surface only and a cover 10 is attached to the upper surface.

In accordance with this invention as described herein, the use of flexible thermoelectric units or thermoelectric modules makes it possible to obtain a flexible thermoelectric sheet. The flexible material used in the thermoelectric sheet could be a thin copper or phosphor bronze plate, or it could be metal netting. A resin sheet that has superior thermal conductivity, such as a thermally conductive silicone sheet, could be used. Alternatively, a suitable plastic or elastomer or the like could be used.

Although FIGS. 17 and 18 show examples of thermoelectric sheets, the present invention is not limited to the form of thermoelectric sheets. It is possible to create thermoelectric sheets of various different forms by using different configurations or by means such as varying the arrangement density of the thermoelectric units or thermoelectric modules thereof.

For example, if the spacing of the array of thermoelectric modules is made larger, that in itself will increase the flexibility of the thermoelectric sheet and also improve the thermal efficiency. In a cooling or heating box, for example, only about one or two thermoelectric modules of dimensions of 40 mm square have been used. Since the thermoelectric modules themselves are so small, they can be installed in any part of the box without limitations. Therefore, to maintain the interior of the box at about 5° C., the temperature of the thermoelectric modules themselves must be set low at about −5° C., and the cooling or heating of the box by the thermal conductivity of the aluminum or copper plates therein must take a long time. In contrast thereto, with a thermoelectric sheet in accordance with this invention in which the thermoelectric units or thermoelectric modules have a low installation density, the thermoelectric sheet itself can be made to have a comparatively large surface area. It is therefore unnecessary to position it locally within the box so it can be disposed over a wide area, which naturally improves its thermal efficiency. In other words, the thermoelectric sheet can be arranged over the entire inner surface of the box, so it is not necessary to make the temperature of the thermoelectric semiconductor elements very low and the desired temperature can also be achieved within a short period of time.

Figure 19:
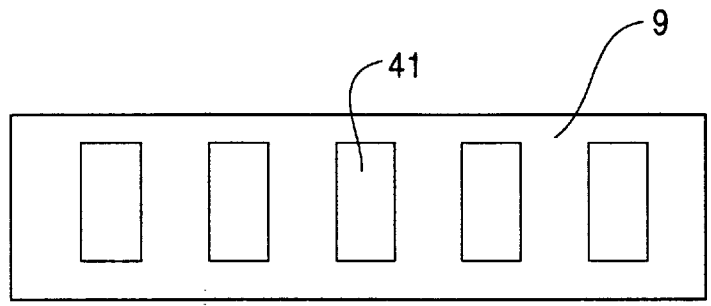
FIG. 19 is a plan view of a further example of a thermoelectric sheet.
Figure 20:
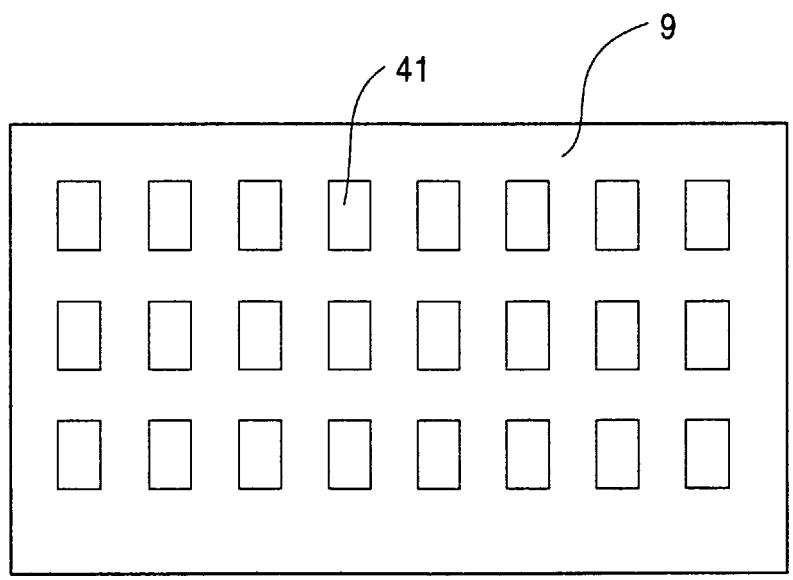
FIG. 20 is a plan view of a still further example of a thermoelectric sheet.

The thermoelectric sheet can be configured as various different shapes of sheet. Moreover, prior-art thermoelectric modules that are not as flexible as the thermoelectric modules of this invention could also be used. For example, five of the prior-art thermoelectric modules 41 are shown in FIG. 19 disposed on a belt-shaped flexible sheet 9. Similarly, three rows of eight prior-art thermoelectric modules 41 are shown in FIG. 20 in a rectangular array. The arrangement thereof can thus be freely selected. Furthermore, the sheet could be a circular sheet, concentric circular sheets, a triangular sheet, or a star-shaped sheet. The most suitable shape can be selected to suit the object to be heated or cooled.

Since this thermoelectric sheet is completely unknown in the prior art, the present inventors are introducing it for the first time. Thermoelectric modules known in the art can be attached to a flexible sheet for use as a thermoelectric sheet, as shown in FIGS. 19 and 20. It is also possible to fabricate a thermoelectric sheet that comprises thermoelectric elements that are known in the art and the thermoelectric elements of this invention, which is expected to dramatically expand the range of applications of thermoelectric semiconductor elements.

Figure 21:
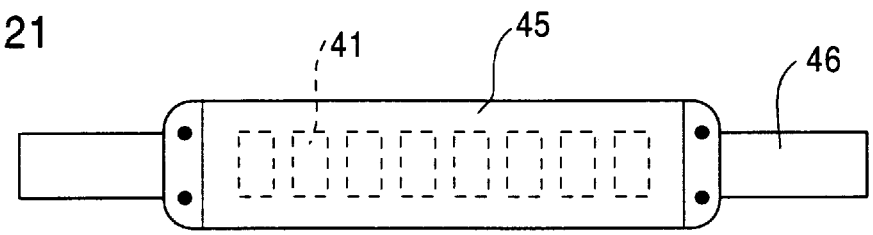
FIG. 21 is a plan view of the structure of a belt-shaped cooling or heating device.
Figure 22:
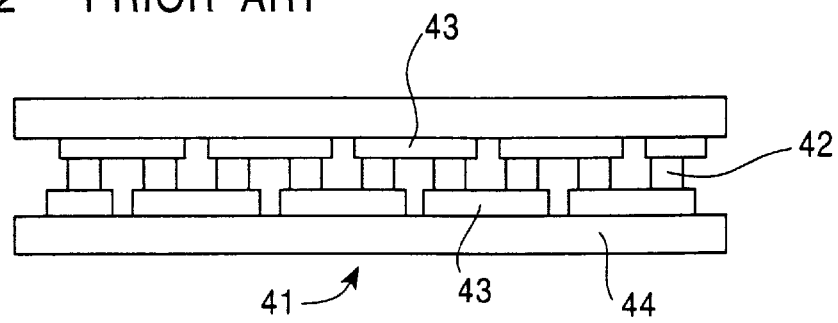
FIG. 22 is a front view of the structure of a prior-art thermoelectric module.

A specific example of a belt-shaped cooling or heating device that can be wound around a head portion, arm portion, or leg portion of a human is shown in FIG. 21 as an example of the application of a flexible thermoelectric sheet. In this cooling or heatingdevice, ordinary commercially available thermoelectric modules 41 are disposed at a certain spacing on a flexible sheet 45 formed of a long, narrow phosphor bronze plate. A band 46 is connected to each end of the flexible sheet 45 for attaching this cooling or heatingdevice to the human body when it is used as a cooling or heating device.

Seven of each of the p-type and n-type thermoelectric semiconductor elements, each 20 mm long and 6 mm wide, are disposed in each thermoelectric module 41 and are held by an aluminum or copper substrate. Eight of these thermoelectric modules 41 are disposed on a thin phosphor bronze plate 45 that is 0.4 mm thick, 150 mm long, and 40 mm wide. Since the phosphor bronze plate used as this sheet is so thin, it is flexible so it can be expected to have an effect of cooling the head and warming the feet if used as a head-band, for example.

In this case, the density of thermoelectric modules 41 attached to the sheet 45 is preferably between 3% and 55%, when expressed as the ratio of the surface area of the thermoelectric semiconductor elements to the effective surface area of the sheet. If the density is greater than 55%, the sheet will lack bendability; if it is less than 3%, there will be no discernible effect from the thermal efficiency viewpoint. Note that the effective surface area in this case refers to the area of this sheet less portions that are used for other purposes (such as the portions in FIG. 21 where the bands 46 are connected to the sheet). The installation density of the thermoelectric modules 41 on the sheet 45 is obtained in practice from a balance of cooling or heating efficiency and flexibility.

The thermoelectric element of this invention is the basis of a thermoelectric chip unit. Inevitably, one of the upper and lower surfaces of a thermoelectric element is at a high temperature and the other surface is at a low temperature. The thermoelectric chip unit that is the basis of this invention is configured of thermoelectric semiconductor element embedded in a chip substrate, so this chip substrate also acts as a separator. In other words, a flow of air is induced between the upper and lower surfaces of an ordinary thermoelectric module, reducing the thermal efficiency, but, since the chip substrate suppresses this flow of air between the upper and lower surfaces of the thermoelectric element of this invention, the thermal efficiency thereof is improved.

The temperature difference generated between the upper and lower surfaces of an ordinary thermoelectric element causes the high-temperature surface to expand and the low-temperature surface to contract, so that the entire thermoelectric element is inevitably subjected to bending and stress deformation. On the other hand, since the chip substrate that acts as a separator in the thermoelectric element based on this invention is flexible, deformations caused by stresses are absorbed and thus the element has the advantage of having a large resistance to repeated stress deformation.

INDUSTRIAL APPLICABILITY

As described above, the thermoelectric unit, thermoelectric module, and thermoelectric sheet of this invention can be used in cooling or heating devices.

An example of the application thereof is a belt-shaped sports appliance, domestic appliance, and or medical appliance used for heating or cooling. Another application example is as a cooling or heating appliance for outdoor use. A specific example thereof is a cooling or heatingbox. The effects obtained when the cooling or heating element of this invention is used in such a box have already been described. A third application example lies in the agricultural field. It can be used to adjust the temperature of a water tank or pot.

A fourth application example lies in the manufacturing field. Since the thermoelectric sheet of this invention is so flexible, it can be adapted with no problems to an object of a complicated shape. For example, it is possible for this thermoelectric sheet to achieve a useful function as a cooling or heating device by wrapping it around a body of a circular cylindrical shape, such as a shaft or bearing. This thermoelectric sheet can also be wrapped around a pipe to adjust the temperature of a fluid flowing through the pipe. If the fluid in the pipe has a comparatively high melting point, it is likely that the fluid in the pipe will solidify and block the pipe if the temperature thereof should fall. In such a case, the fluid can be transported without solidifying, by using the thermoelectric sheet of this invention to maintain the temperature thereof. In addition, this device can be used for cooling or heating a motor or other mechanism within a factory.

A fifth application is apparel. For example, this device can be applied to clothing for racers, cold-protection clothing used outdoors, cold-protection clothing for people working inside refrigerators, heating or cooling industrial clothing in extremely cold or hot places, or fire-fighting gear.

What is claimed is:

1. A thermoelectric element comprising equal numbers of n-type thermoelectric semiconductor elements and p-type thermoelectric semiconductor elements, together with a single chip substrate, wherein said n-type thermoelectric semiconductor elements and p-type thermoelectric semiconductor elements are held embedded within said chip substrate, wherein the thermoelectric semiconductor elements are connected by electrodes, and wherein the electrodes are formed of a flexible conductive material.

2. The thermoelectric element of claim 1, further covered with a flexible material.

3. The thermoelectric element of claim 1, further mounted on a flexible sheet.

4. A thermoelectric element comprising equal numbers of n-type thermoelectric semiconductor elements and p-type thermoelectric semiconductor elements, together with a single chip substrate, wherein said n-type thermoelectric semiconductor elements and p-type thermoelectric semiconductor elements are held embedded within said chip substrate, wherein the thermoelectric semiconductor elements are connected by electrodes, and further covered with a flexible material.

5. The thermoelectric element of claim 4, further mounted on a flexible sheet.

6. A thermoelectric element comprising equal numbers of n-type thermoelectric semiconductor elements and p-type thermoelectric semiconductor elements, together with a single chip substrate, wherein said n-type thermoelectric semiconductor elements and p-type thermoelectric semiconductor elements are held embedded within said chip substrate, wherein the thermoelectric semiconductor elements are connected by electrodes, and further covered with a flexible material and further mounted on a flexible sheet.

7. A thermoelectric element wherein thermoelectric elements, each configured of a thermoelectric semiconductor element sandwiched between a heat-absorbing side substrate and heat-radiating side substrate, are attached at a certain spacing to a flexible sheet.

8. A cooling or heating device using a thermoelectric element as a cooling or heating source, wherein the thermoelectric element is configured of equal numbers of n-type thermoelectric semiconductor elements and p-type thermoelectric semiconductor elements, a single chip substrate formed of a flexible insulator, and electrodes; said n-type thermoelectric semiconductor elements and p-type thermoelectric semiconductor elements are held embedded in said chip substrate; said thermoelectric semiconductor elements are connected by electrodes, and said thermoelectric element is covered with a flexible material.

9. The cooling or heating device of claim 8, wherein the electrodes are formed of a flexible conductive material.

10. A cooling or heating device using a thermoelectric element as a cooling or heating source, wherein the thermoelectric element is configured of equal numbers of n-type thermoelectric semiconductor elements and p-type thermoelectric semiconductor elements, a single chip substrate formed of a flexible insulator, and electrodes; said n-type thermoelectric semiconductor elements and p-type thermoelectric semiconductor elements are held embedded in said chip substrate; said thermoelectric semiconductor elements are connected by electrodes, said thermoelectric element is covered with a flexible material; and said thermoelectric element is mounted on a flexible sheet.

11. The cooling or heating device of claim 10, wherein the electrodes are formed of a flexible conductive material.

12. A cooling or heating device using a thermoelectric element as a cooling or heating source, wherein thermoelectric elements, each configured of a thermoelectric semiconductor element sandwiched between a heat-absorbing side substrate and heat-radiating side substrate, are attached at a certain spacing to a flexible sheet.

* * * * *